US011562907B2

(12) United States Patent
Camagong et al.

(10) Patent No.: US 11,562,907 B2
(45) Date of Patent: Jan. 24, 2023

(54) NANOSTRUCTURE FEATURING NANO-TOPOGRAPHY WITH OPTIMIZED ELECTRICAL AND BIOCHEMICAL PROPERTIES

(71) Applicant: International Business Machines Corporation, Armonk, NY (US)

(72) Inventors: Cristina Camagong, Ridgefield, CT (US); Hariklia Deligianni, Alpine, NJ (US); Damon B. Farmer, White Plains, NY (US); Andrei Fustochenko, New City, NY (US); Ying He, Champaign, IL (US); Emily R. Kinser, Poughkeepsie, NY (US); Yu Luo, Hopewell Junction, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

(21) Appl. No.: 16/204,438

(22) Filed: Nov. 29, 2018

(65) Prior Publication Data
US 2020/0176262 A1    Jun. 4, 2020

(51) Int. Cl.
*H01L 21/30* (2006.01)
*H01L 21/308* (2006.01)
(Continued)

(52) U.S. Cl.
CPC ...... *H01L 21/3081* (2013.01); *B81C 1/00031* (2013.01); *G03F 7/0002* (2013.01);
(Continued)

(58) Field of Classification Search
None
See application file for complete search history.

(56) References Cited

U.S. PATENT DOCUMENTS 4,969,468 A   11/1990 Byers et al.
6,171,239 B1   1/2001 Humphrey
(Continued)

FOREIGN PATENT DOCUMENTS

CN   104502429 A   4/2015
CN   104502429 A   10/2015
(Continued)

OTHER PUBLICATIONS

G. Cao, D. Liu, "Template-based Synthesis of Nanorod, Nanowire, and Nanotube Arrays", Adv. Colloid Interface Sci. 2008, 136, 45-64. Available online Jul. 26, 2007. (Year: 2007).*
(Continued)

*Primary Examiner* — Daniel McNally
(74) *Attorney, Agent, or Firm* — Cantor Colburn LLP; Stosch Sabo

(57) ABSTRACT

A method for forming a nanostructure includes coating an exposed surface of a base layer with a patterning layer. The method further includes forming a pattern in the patterning layer including nano-patterned non-random openings, such that a bottom portion of the non-random openings provides direct access to the exposed surface of the base layer. The method also includes depositing a material in the non-random openings in the patterning layer, such that the material contacts the exposed surface to produce repeating individually articulated nano-scale features. The method includes removing remaining portions of the patterning layer. The method further includes forming an encapsulation layer on exposed surfaces of the repeating individually articulated nanoscale features and the exposed surface of the base layer.

17 Claims, 17 Drawing Sheets

(51) Int. Cl.
*B81C 1/00* (2006.01)
*G03F 7/00* (2006.01)
*B82Y 10/00* (2011.01)
*B82Y 40/00* (2011.01)
*B82Y 30/00* (2011.01)
*B82Y 15/00* (2011.01)

(52) U.S. Cl.
CPC .............. *B82Y 10/00* (2013.01); *B82Y 15/00* (2013.01); *B82Y 30/00* (2013.01); *B82Y 40/00* (2013.01)

(56) References Cited

U.S. PATENT DOCUMENTS

| | | |
|---|---|---|
| 6,359,444 B1 | 3/2002 | Grimes |
| D469,540 S | 1/2003 | Holker et al. |
| 6,914,279 B2 | 7/2005 | Lu et al. |
| 7,005,048 B1 | 2/2006 | Watanabe et al. |
| 7,006,859 B1 | 2/2006 | Osorio et al. |
| 7,212,851 B2 | 5/2007 | Donoghue et al. |
| 7,294,910 B2 | 11/2007 | Thomas et al. |
| 7,524,408 B2 | 4/2009 | Monbouquette et al. |
| 7,894,914 B2 | 2/2011 | Stahmann et al. |
| 7,949,382 B2 | 5/2011 | Jina |
| 7,955,483 B2 | 7/2011 | Gu et al. |
| 8,076,125 B2 | 12/2011 | McGimpsey |
| 8,097,926 B2 | 1/2012 | De Graff et al. |
| 8,221,822 B2 | 7/2012 | Flanagan et al. |
| 8,255,061 B2 | 8/2012 | Perlin et al. |
| 8,355,768 B2 | 1/2013 | Masmanidis et al. |
| 8,529,835 B2 | 9/2013 | Kaplan et al. |
| 8,574,789 B1 | 11/2013 | Shelnutt et al. |
| 8,668,978 B2 | 3/2014 | Malima et al. |
| 8,708,966 B2 | 4/2014 | Allen et al. |
| 8,741,380 B2 | 6/2014 | Yoshida et al. |
| 8,772,228 B2 | 7/2014 | Stupp et al. |
| 8,808,516 B2 | 8/2014 | Melosh et al. |
| 8,831,750 B2 | 9/2014 | Ramachandran et al. |
| 8,888,969 B2 | 11/2014 | Soleymani et al. |
| 9,095,267 B2 | 8/2015 | Halpern et al. |
| 9,243,277 B2 | 1/2016 | Rajagopal et al. |
| 9,662,498 B1 | 5/2017 | Son et al. |
| 9,844,660 B2 | 12/2017 | Vetter et al. |
| 2003/0100823 A1 | 5/2003 | Kipke et al. |
| 2005/0269285 A1 | 12/2005 | Jung et al. |
| 2006/0293578 A1 | 12/2006 | Rennaker, II |
| 2007/0106143 A1 | 5/2007 | Flaherty |
| 2008/0177363 A1 | 7/2008 | Schouenborg |
| 2008/0214920 A1 | 9/2008 | Merz et al. |
| 2009/0155800 A1 | 7/2009 | Hong et al. |
| 2009/0243584 A1 | 10/2009 | Zhang et al. |
| 2010/0006451 A1 | 1/2010 | Gordon |
| 2010/0241086 A1 | 9/2010 | Yodfat et al. |
| 2010/0318193 A1 | 12/2010 | Desai et al. |
| 2011/0091510 A1 | 4/2011 | Lele et al. |
| 2011/0230735 A1 | 9/2011 | Wolfe et al. |
| 2011/0301716 A1 | 12/2011 | Sirivisoot et al. |
| 2012/0218550 A1 | 8/2012 | O'Mahony |
| 2013/0200437 A1 | 8/2013 | Rha |
| 2014/0230854 A1 | 8/2014 | Lopez et al. |
| 2014/0238574 A1 | 8/2014 | Kinser et al. |
| 2015/0133761 A1 | 5/2015 | Vetter et al. |
| 2016/0041159 A1 | 2/2016 | Labaer et al. |
| 2016/0257959 A1 | 9/2016 | Alsager et al. |
| 2016/0281147 A1 | 9/2016 | Besant et al. |
| 2017/0209079 A1 | 7/2017 | Kinser et al. |
| 2018/0020957 A1 | 1/2018 | Kinser |
| 2018/0353750 A1 | 12/2018 | Hetke et al. |
| 2020/0170523 A1 | 6/2020 | Deligianni et al. |
| 2020/0173953 A1 | 6/2020 | Camagong et al. |

FOREIGN PATENT DOCUMENTS

| | | |
|---|---|---|
| CN | 107589163 A | 8/2017 |
| CN | 107589163 A | 1/2018 |
| KR | 101203898 B1 | 11/2012 |
| WO | 2010003212 A1 | 1/2010 |

OTHER PUBLICATIONS

R. Zou, Z. Zhang, M. F. Yuen, J. Hu, C.-S. Lee, W. Zhang, "Dendritic Heterojunction Nanowire Arrays for High-Performance Supercapacitors", Sci. Rep. 2015, 5, 7862. (Year: 2015).*

Cristina Camagong, et al., "Nanostructure Featuring Nano-Topography With Optimized Electrical and Biochemical Properties", U.S. Appl. No. 16/204,545, filed Nov. 29, 2018.

Deshpande et al., "Development of a nanoscale heterostructured glucose sensor using modified micorfabrication processes", J. of Micro/Nanolithography MEMS MEOMS, vol. 7(2), Apr.-Jun. 2008, 6 pages.

Freckmann et al. "System Accuracy Evaluation of 27 Blood Glucose Monitoring Systems According to DIN EN ISO 15197", Diabetes Technology & Therapeutics, vol. 12, No. 3, 2010, 12, pp. 221-231.

Hariklia Deligianni, et al., "Three-Dimensional Silicon-Based Comb Probe With Optimized Biocompatible Dimensions for Neural Sensing & Stimulation", U.S. Appl. No. 16/204,607, filed Nov. 29, 2018.

Janine Gajdzik, et al., "Enzyme immobilisation on self-organised nanopatterned electrode surfaces", www.rsc.org/pccp | Physical Chemistry Chemical Physics, Received Jun. 16, 2010, Accepted Aug. 12, 2010, pp. 12604-12607.

List of IBM Patents or Patent Applications Treated as Related; (Appendix P), Filed Nov. 30, 2018, 2 pages.

Marco Cardosi et al., "Amperometric Glucose Sensors for Whole Blood Measurement Based on Dehydrogenase Enzymes", INTECH Open Science Open Minds, Chapter 13, 2012 pp. 319-354.

Parng, et al., "Effect of temperature and glucose concentration on a glass-based sensor for long-term stability investigation", Journal of Micro/Nanolithography MEMS MEOMS. vol. 10(1) Jan.-Mar. 2011 pp. 5.

Roy R. Yu, et al., "Three-Dimensional Silicon-Based Comb Probe", U.S. Appl. No. 16/204,703, filed Nov. 29, 2018.

Zhai et al., "Highly Sensitive Glucose Sensor Based on Pt Nanoparticle/Polyaniline Hydrogel Heterostructures", ACS Manoparticles, vol. 7(4), 2013, pp. 3540-3546.

Lou et al., "Electroplating", Encyclopedia of Chemical Processing, 2006 (10 pages).

Kim, Sohee et al., "Thermal impact of an active 3-D microelectrode array implanted in the brain." IEEE Transactions on Neural Systems and Rehabilitation Engineering, vol. 15, No. 4, 2007, pp. 493-501.

Kinser, Emily R. et al., "Nanopatterned Bulk Metallic Glass Biosensors", ACS Sensors, vol. 2, No. 12, 2017, 30 pp.

Martel, S. et al., "Development of a wireless brain implant: the telemetric electrode array system (TEAS) project." 23rd Annual International Conference of the Engineering in Medicine and Biology Society, 2001, pp. 3594-3597.

Padmanabhan et al., "Engineering Cellular Response Using Nanopatterned Bulk Metallic Glass", ACS Nano Article, 2014, vol. 8, No. 5, pp. 4366-4375.

Yuan Yuan et al., "Seed-mediated synthesis of dendritic platinum nanostructures with high catalytic activity for aqueous-phase hydrogenation of acetophenone", Journal of Energy Chemistry 24 (2015) 660-668.

* cited by examiner

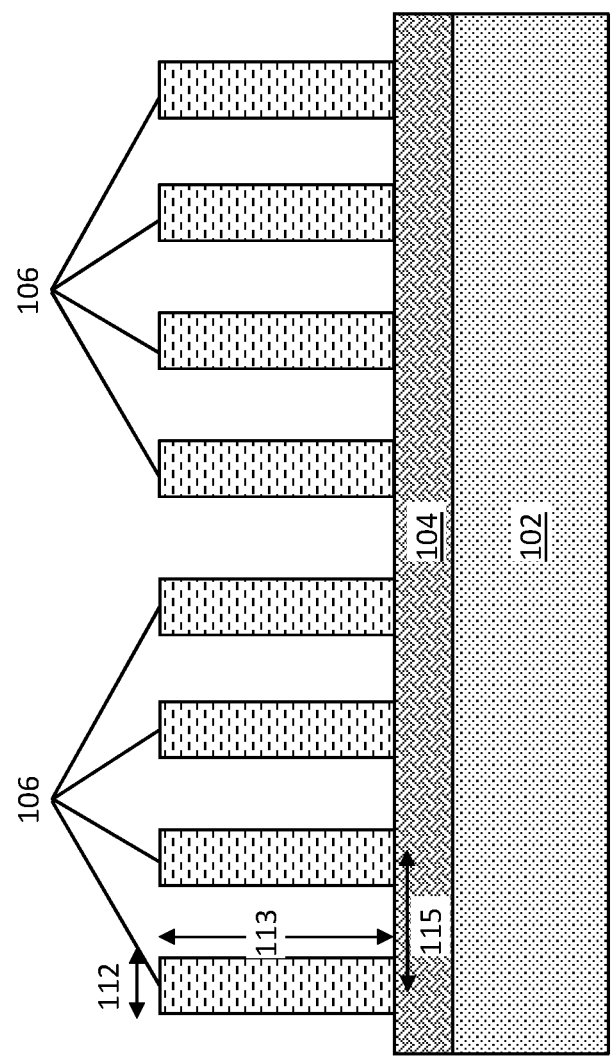

NANOSTRUCTURE FEATURING NANO-TOPOGRAPHY WITH OPTIMIZED ELECTRICAL AND BIOCHEMICAL PROPERTIES

BACKGROUND

The present invention generally relates to nanostructures. More specifically, the present invention relates to nanostructures featuring nano-topography with optimized electrical and biochemical properties, which can be utilized for biological applications.

A biosensor is an analytical device that can be utilized to collect information about a biological system. Data collection methods can include, but are not limited to, optical, acoustic, electrical, and electrochemical systems. Biosensors can incorporate a sensitive biological component to positively identify a specific biological component in a given system, such as an enzyme, or biosensors can be utilized without any additional biological elements, which is referred to as "label-free" sensing. Electrochemical biosensing systems typically include a biological component and a physicochemical detector, which work together to detect an analyte with specificity, which generates an electric signal as output. The sensitive biological component/element, e.g., tissue, microorganism, organelle, cell receptor, enzyme, antibody, nucleic acid, etc., is a biologically derived material or biomimetic component that interacts with, binds to, or otherwise recognizes the analyte. Examples of such pairings include reactions related to antibodies and antigens, enzymes and substrates, and pairings of single strands of DNA. Cell receptors, organelles, microorganisms, and tissues can carry such receptors. The biologically sensitive element can also be created by biological engineering.

In the specific case of electrochemical biosensing, once a receptor is paired with a target, a redox reaction produces a product, such as ft or electrons, and the physiochemical sensor detects the reaction signals. For other means of biosensing, fluorophore molecules with specific binding reactions can also be used for detection, or other analytical methods such as Raman spectroscopy can be utilized to identify specific biological components.

Biosensors with enhanced signal and sensitivity provide reliable data for both medical and environmental monitoring. Such biosensors are especially needed for areas related to food and water supply security, as well as the healthcare industry.

In healthcare, glucose sensors contribute to a significant portion of the existing biosensor market. A signal from a glucose sensor is typically generated via an electrode that is exposed to a glucose-containing biological substance, such as blood. A bioactive agent is physically applied to or arranged adjacent to the electrode, which is typically an enzyme such as glucose oxidase or glucose dehydrogenase. The majority of glucose sensors are designed for testing external to the human body in the "test strip" form as single-use sensors. Additionally, in vivo glucose sensors that are implanted into a human body can be used to continuously monitor blood sugar. However, the body's foreign body response restricts, e.g., affects and reduces the effectiveness of, in vivo biosensors. Moreover, the foreign body response can reduce the sensor signal output over time.

The electrode within a glucose biosensor serves two critical purposes. A first purpose is a physical surface on which the enzyme can be located, and a second purpose is a means of conducting the electrical signal that is generated in response to the specific electrochemical reaction. Typically, a glucose biosensor includes two electrodes, including a "working" electrode that is loaded with, or arranged in the proximity of, enzyme and a reference electrode. Ideally, a third counter electrode can also be added to enhance the signal-to-noise ratio. Platinum (Pt), for example, has demonstrated biocompatibility and is frequently used as a working electrode in electrochemical biosensors. Additional electrode materials can include carbon, gold, or other materials known in the art. The target electrochemical reaction typically determines the electrode material selection. External "test strip" electrochemical sensors can include platinum electrodes, for example.

SUMMARY

Embodiments of the present invention are directed to a method for forming a nanostructure. A non-limiting example of the method includes coating an exposed surface of a base layer with a patterning layer. The method further includes forming a pattern in the patterning layer including nano-patterned non-random openings, such that a bottom portion of the non-random openings provides direct access to the exposed surface of the base layer. The method also includes depositing a material in the non-random openings in the patterning layer, such that the material contacts the exposed surface to produce repeating individually articulated nanoscale features. The method includes removing remaining portions of the patterning layer. The method further includes forming an encapsulation layer on exposed surfaces of the repeating individually articulated nanoscale features and the exposed surface of the base layer.

Another non-limiting example of the method includes coating an exposed surface of a base layer with a patterning layer. The method further includes forming a pattern in the patterning layer including nano-patterned non-random openings, such that a bottom portion of the non-random openings provides direct access to the exposed surface of the base layer. The method includes depositing a material in the nano-patterned non-random openings in the patterning layer, such that the material contacts the exposed surface to produce repeating individually articulated nano-scale features. The method also includes removing remaining portions of the patterning layer. The method further includes forming a textured layer on exposed surfaces of the repeating individually articulated nanoscale features and the exposed surface of the base layer.

Another non-limiting example of the method includes coating an exposed surface of a base layer with a patterning layer. The method further includes forming a pattern in the patterning layer including nano-patterned non-random openings, such that a bottom portion of the non-random openings provides direct access to the exposed surface of the base layer. The method also includes depositing a material in the non-random openings in the patterning layer, such that the material contacts the exposed surface to produce repeating individually articulated nano-scale features having a textured surface. The method further includes removing remaining portions of the patterning layer. The repeating individually articulated nanoscale features and the textured surface are formed as a single structure without an interface therebetween.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A-1F depict a method of forming a nanostructure according to one or more embodiments of the present invention, in which:

FIG. 1A depicts a cross-sectional side view of a patterning layer arranged on a substrate and a base layer;

FIG. 1B depicts a cross-sectional side view after forming a pattern of openings in the patterning layer;

FIG. 1C depicts a cross-sectional side view after depositing a material in the openings of the patterning layer;

FIG. 1D depicts a cross-sectional side view after removing the patterning layer to reveal an array of nano-patterned features on the base layer;

FIG. 1E depicts a cross-sectional side view after depositing an encapsulation layer on the nano-patterned features; and FIG. 1F depicts a cross-sectional side view after functionalizing the surface of the encapsulation layer;

FIGS. 2A-2D depict a method of forming a nanostructure according to one or more embodiments of the present invention, in which:

FIG. 2A depicts a cross-sectional side view after depositing a material in the openings of the patterning layer;

FIG. 2B depicts a cross-sectional side view after removing the patterning layer to reveal an array of nano-patterned features on the base layer;

FIG. 2C depicts a cross-sectional side view after depositing a textured layer of metal on the nano-patterned features; and FIG. 2D depicts a cross-sectional side view after functionalizing the surface of the textured layer of metal;

FIGS. 3A-3D depict a method of forming a nanostructure according to one or more embodiments of the present invention, in which:

FIG. 3A depicts a cross-sectional side view after depositing a material in the openings of the patterning layer;

FIG. 3B depicts a cross-sectional side view after removing the patterning layer to reveal an array of nano-patterned features on the base layer;

FIG. 3C depicts a cross-sectional side view after depositing a textured layer of metal on the nano-patterned features; and FIG. 3D depicts a cross-sectional side view after functionalizing the surface of the textured layer of metal;

FIGS. 4A-4C depict a method of forming a nanostructure according to one or more embodiments of the present invention, in which:

FIG. 4A depicts a cross-sectional side view after depositing a material in the openings of the patterning layer;

FIG. 4B depicts a cross-sectional side view after removing the patterning layer to reveal an array of nano-patterned features on the base layer;

FIG. 4C depicts a cross-sectional side view after functionalizing the surface of the nano-patterned features.

Figure 1A:
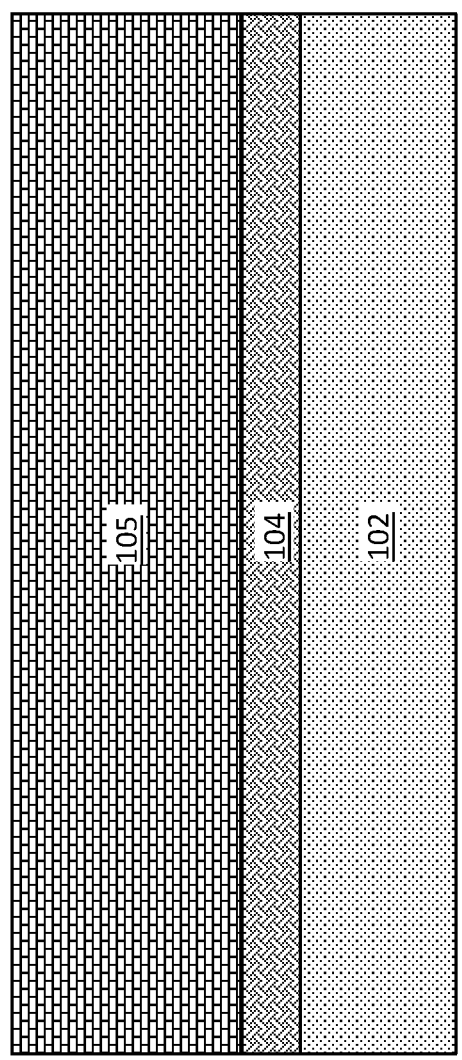

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor fabrication may or may not be described in detail herein. Moreover, the various tasks and process steps described herein can be incorporated into a more comprehensive procedure or process having additional steps or functionality not described in detail herein. In particular, various steps in the manufacture of semiconductors are well-known and so, in the interest of brevity, many conventional steps will only be mentioned briefly herein or will be omitted entirely without providing the well-known process details.

Turning now to an overview of technologies that are more specifically relevant to aspects of the invention, biosensors with enhanced sensor and signal sensitivity are needed in a variety of areas, including, for example, healthcare. The incorporation of topography with nano-scale features, referred to as nano-topography, on biosensor electrodes not only enhances signal and sensitivity due to increased surface area, such structures also can mitigate the biological foreign body response.

Platinum electrodes provide several advantages in biosensors. Platinum is considered to be a bio-compatible material. Platinum electrodes also are sensitive and can detect oxidants, which are relevant for enzyme-substrate systems, for example, in which glucose is reactant, such as glucose oxidase and glucose dehydrogenase. Glucose oxidase reacts with glucose to produce hydrogen peroxide, which decomposes via a reduction-oxidation reaction to result in W ions and electrons. The platinum electrode then detects the electrical signal that is proportional to the concentration of glucose. The exposed electrode surface also serves as a platform on which a target enzyme can reside. Additional surface area on the electrode enables increased enzyme loading, enhanced signal detection capability, and additional sensitivity to the target electrochemical reactions.

Despite the advantages associated with platinum as an electrode material, however, traditional platinum fabrication methods are not conducive to forming electrode surfaces with nano-topography in a consistent pattern and a high aspect ratio form-factor. The incorporation of high aspect ratio nano-topography, including but not limited to nano-rod structures, is necessary to achieve the electrical benefits of nano-patterned electrodes. Traditional platinum fabrication methods to produce articulated structures provide challenges. For example, atomic layer deposition (ALD) includes multiple process passes to produce a stand-along structure, whereas resulting films formed using PVD methods are too thick to form fine nanostructures. Additionally, due to the precious nature and high cost of platinum, manufacturers generally desire to use as little platinum as possible in final device structures.

Turning now to an overview of the aspects of the invention, one or more embodiments of the invention address the above-described shortcomings of the prior art by providing methods for fabricating nano-patterned biosensor structures featuring consistent nano-topography with increased surface area and therefore optimized biosensor properties. According to one or more embodiments of the present invention, nano-patterned biosensor structures include gold nano-rods coated with a thin encapsulating layer of platinum. According to other embodiments of the present invention, gold and platinum nanorod structures are coated with a textured surface that results in an additional increase in effective surface area.

The above-described aspects of the invention address the shortcomings of the prior art by using nano-topography on the sensor surface to significantly increase the exposed surface area, and therefore, the signal and sensitivity of the electrode. Using crystalline gold or platinum rather than other amorphous biocompatible materials, such as bulk metallic glass, also increases the electrical conductivity of an electrochemical biosensor electrode. The nano-patterned arrays incorporating repeatable structures, such as nanorods have high uniformity. With the additional biosensor surface area resulting from the presence of said nano-structures, the biosensors have increased structural stability and improved consistency in signal output. The use of a thin encapsulating layer of platinum to enable both biocompatibility and use as an electrochemical biosensor, instead of forming the entire nanorod structure from platinum, reduces bio sensor cost and conserves platinum, which is in scarce supply. More importantly, the production process can be on executed using semiconductor-compatible processing, which enables scalability for mass production and more precise process control.

Turning now to a more detailed description of aspects of the present invention, FIGS. 1A-1F depict a method of forming nanostructure according to one or more embodiments of the present invention. FIG. 1A depicts a cross-sectional side view of a patterning layer 105 arranged on a base layer 104 and a substrate 102.

According to one or more embodiments of the present invention, the substrate 102 includes a semiconductor material. Examples of semiconductor materials known to those skilled in the art which can be used as substrate 102 include Si, SiGe, SiGeC, SiC, Ge alloys, III/V compound semiconductors or II/VI compound semiconductors. In some embodiments of the present invention, the substrate 102 includes a single semiconductor material. In other embodiments of the present invention, the substrate 102 includes a multilayered stack of semiconductor materials.

In one or more embodiments of the present invention, the semiconductor material that can provide substrate 102 is a single crystalline semiconductor material such as, for example, single crystalline silicon. In other embodiments of the present invention, the semiconductor material that can provide substrate 102 is a polycrystalline semiconductor material such as, for example, polycrystalline silicon. In yet further embodiments of the present invention, the semiconductor material that can provide substrate 102 is an amorphous semiconductor material such as, for example, amorphous silicon. According to some embodiments of the present invention, the semiconductor material that provides substrate 102 is a bulk semiconductor material.

Another material that can be used as substrate 102 is a dielectric material. A "dielectric material" is a material (i.e., insulator) that does not conduct electricity readily. In one or more embodiments of the present invention, the dielectric material of the substrate 102 includes a semiconductor oxide such as, for example, silicon dioxide. In other embodiments of the present invention, the dielectric material that can provide substrate 102 includes a semiconductor nitride such as, for example, silicon nitride. Other dielectric materials such as, for example, dielectric oxides, including metal oxides such as aluminum oxide, can also be used in the substrate 102.

In some embodiments of the present invention, substrate 102 includes a combination of a semiconductor material and a dielectric material. For example, substrate 102 can include a material stack of, from bottom to top, a silicon dioxide layer and a silicon layer. An optional handle substrate can be located beneath the silicon dioxide layer. The optional handle substrate can include of a semiconductor material, insulator, or conductive material.

Substrate 102 can also include a ceramic material, an elemental metal, an alloy of an elemental material or any other material or combination of materials that can be readily patterned as described herein and thereafter readily removed from an electrode structure that is subsequently formed to provide substrate 102. According to one or more embodiments of the present invention, the substrate 102 includes one or more polymeric materials. The polymeric materials can be natural or synthetic polymers or copolymers, such as block copolymers.

The base layer 104 arranged on the substrate 102 includes one or more materials. The base layer 104 can be any material. The material can be a conductive material, such as a metal, but does not need to be conductive material. According to some embodiments of the present invention, the material is a conductive electrode material (e.g., electrically conductive material) such that the base layer 104 provides an electrode base. The material can include a metallic material, including an alloy of more than one metal. The conductive material can include an alloy of metallic components, or metallic and non-metallic components. The conductive material can include, but is not limited to, platinum, copper, silver, gold, tungsten, aluminum, iron, palladium, nickel, titanium, zirconium, phosphorus, carbon, or a combination thereof. In one or more embodiments of the present invention, the conductive material is in a crystalline state. In other embodiments of the present invention, the conductive material is in an amorphous state.

The base layer 104 includes one or more layers. According to one or more embodiments of the present invention, the base layer 104 includes more than one layer, such as one or more metallic seed layers. Non-limiting examples of metallic seed layers include Ti, Au, Cu, Pt, or a combination thereof. The thickness of the metallic seed layer, when included, may range from less than 10 nanometers to an excess of 10 microns, which is not limited within the scope of embodiments of the present invention. Electrical resistance of the metallic seed layer is less than or equal to 100 ohms according to one or more embodiments of the present invention, and less than 1 ohm according to other embodiments of the present invention.

The patterning layer 105 includes one or more mask and/or pattern transfer layers. The pattern transfer layers can be photo-sensitive. Alternatively, a dielectric layer, which is not photo-sensitive, commonly referred to as a "hard mask," can be used in conjunction with a photo-sensitive layer, or independently. According to one or more embodiments of the present invention, the patterning layer is a photoresist layer.

Figure 1B:
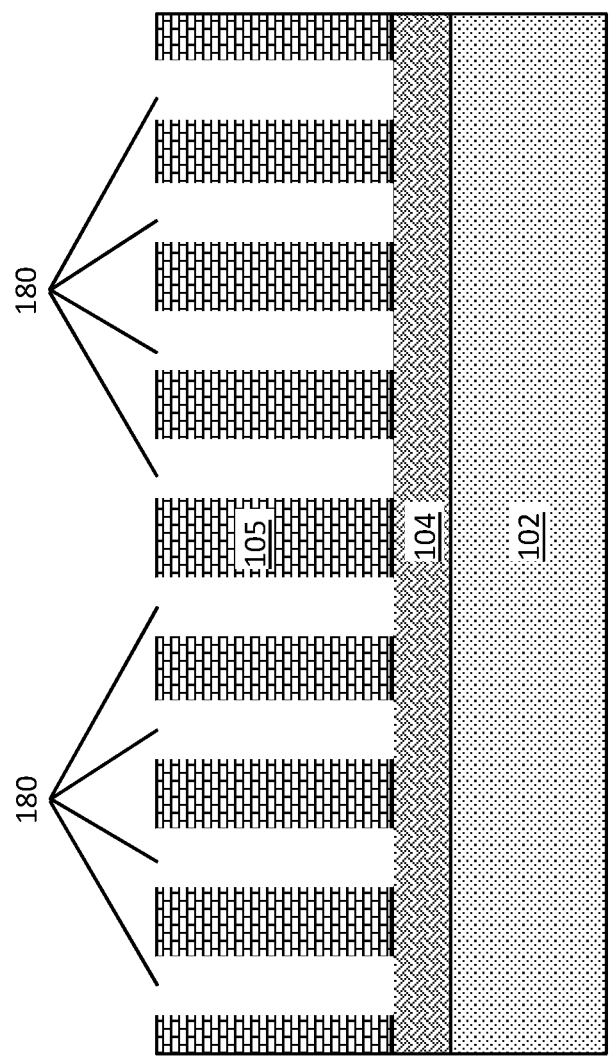

FIG. 1B depicts a cross-sectional side view after forming a pattern of openings 180 in the patterning layer 105. The pattern formed in the patterning layer 105 includes nano-patterned non-random openings 180 (arranged in an ordered array), such that a bottom portion of the non-random openings 180 provides direct access to the exposed surface of the base layer 104. The exposed surfaces of base layer 104 are generated from the selective removal of patterning layer 105. The openings 180 in the patterning layer 105 are formed by exposing to a desired pattern of radiation, which is a process known to those skilled in the art as photolithography. The desired pattern can be created in the photo-sensitive layer using a photomask with a predefined pattern. Exposure to the source of radiation can cause crosslinking in a selected portion of the photo-sensitive layer, with the portion of crosslinking dictated by the photomask utilized as part of the patterning process. Then the exposed photoresist is then developed with a resist developer, and portions of the photoresist is then removed to result in the desired pattern created in patterning layer 105. Additional methods can be utilized to generate desired patterns in the patterning layer 105, such as e-beam lithography, nano-imprint lithography, or other methods known to those skilled in the art.

Figure 1C:
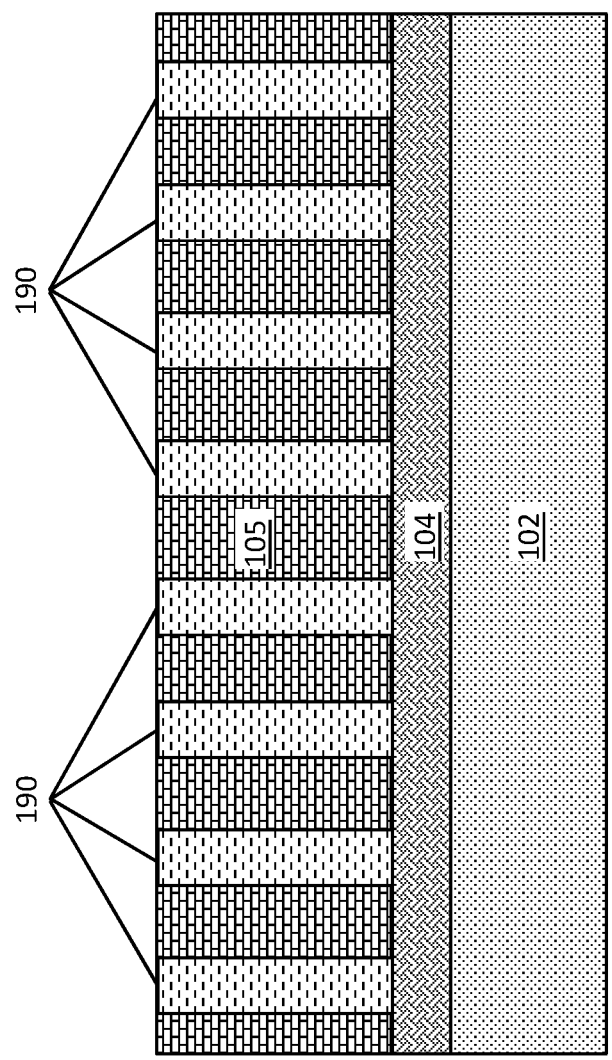

FIG. 1C depicts a cross-sectional side view after depositing a material 190 in the openings 180 of the patterning layer 105. The material 190 includes one or more conductive material(s). The conductive material which is deposited into openings 180 forms form the nano-patterned features 106 (see FIG. 1D) and can be the same as the conductive material forming the base layer 104 according to some embodiments of the present invention. In other embodiments of the present invention, the conductive material forming the nano-patterned features 106 is different than the conductive material forming the base layer 104. The conductive material 190 can include a metallic material, including an alloy of more than one metal. The conductive material 190 can include an alloy of metallic components, or an alloy of metallic and non-metallic components. The conductive material 190 can include, but is not limited to, platinum, copper, silver, gold, tungsten, aluminum, iron, palladium, nickel, titanium, zirconium, phosphorus, carbon, or a combination thereof. In one or more embodiments of the present invention, the conductive material is in a crystalline state.

Depending on the material 190, various deposition methods can be used to fill the openings 180 of the patterning layer 105. According to some embodiments of the present invention, material 190 is deposited using electroplating. Electroplating also can be used to directly form the nano-patterned features 106 (without a patterning layer) having the desired dimensions in some embodiments of the present invention.

In other embodiments of the present invention, the material 190 is deposited and overgrown in the openings 180 of the patterning layer 105 and subsequently etched back or polished to the desired size/shape/dimension.

According to one or more embodiments of the present invention, physical vapor deposition is used to deposit the material 190 in the openings 180 of the patterning layer 105. According to some embodiments of the present invention, atomic layer deposition is used to deposit the material 190 in the openings 180 of the patterning layer 105.

FIG. 1D depicts a cross-sectional side view after removing the patterning layer 150 to reveal an array of nano-patterned features 106 on the base layer 104. Remaining portions of the patterning layer 105 are removed by one or more etching and/or ashing processes. Etching processes can include reactive ion etching (RIE) or wet chemical etching.

The nano-patterned features 106 revealed are an array of non-random (i.e., regular repeating) repeating individually articulated features formed on the base layer 104. The form factor of the individual features and the properties of the array can be defined by the photomask or method previously utilized to generate the desired pattern in patterning layer 105. The repeating individually articulated features can have various shapes and sizes. Non-limiting examples of shapes for each repeating individually articulated features include rods, cones, annular structures (e.g., hollow tubes), or any combination thereof.

In one or more embodiments of the present invention, the nano-patterned features 106 have a critical dimension 112, i.e., diameter or width, from about 5 nm to about 900 nm. In other embodiments of the present invention, the nano-patterned features 106 have a critical dimension from about 20 nm to about 300 nm. In some embodiments of the present invention, the nano-patterned features 106 have a height 113 ranging between 5 nm to 20 micrometers (μm). In one or more embodiments of the present invention, each of nano-patterned features 106 has an aspect ratio (i.e., ratio of width to height) of from about 0.5:1 to about 50:1. In other embodiments of the present invention, each of nano-patterned features 106 has a pitch 115, and a pitch ratio ranging from about 2:1 to 20:1. "Pitch ratio" (115:112) refers to the ratio of the minimum center-to-center distance of nearest-neighbor features 115 with respect to the critical diameter of the nano-topography elements 112.

According to one or more embodiments of the present invention, the nano-patterned features 106 include gold. In an additional embodiments of the present invention, the nano-patterned features 106 can include platinum. In yet other embodiments of the present invention, a combination of gold and platinum can be utilized. Using gold and/or platinum for the nano-patterned feature material platform provides advantages of being both semiconductor compatible and biocompatible.

Figure 1E:
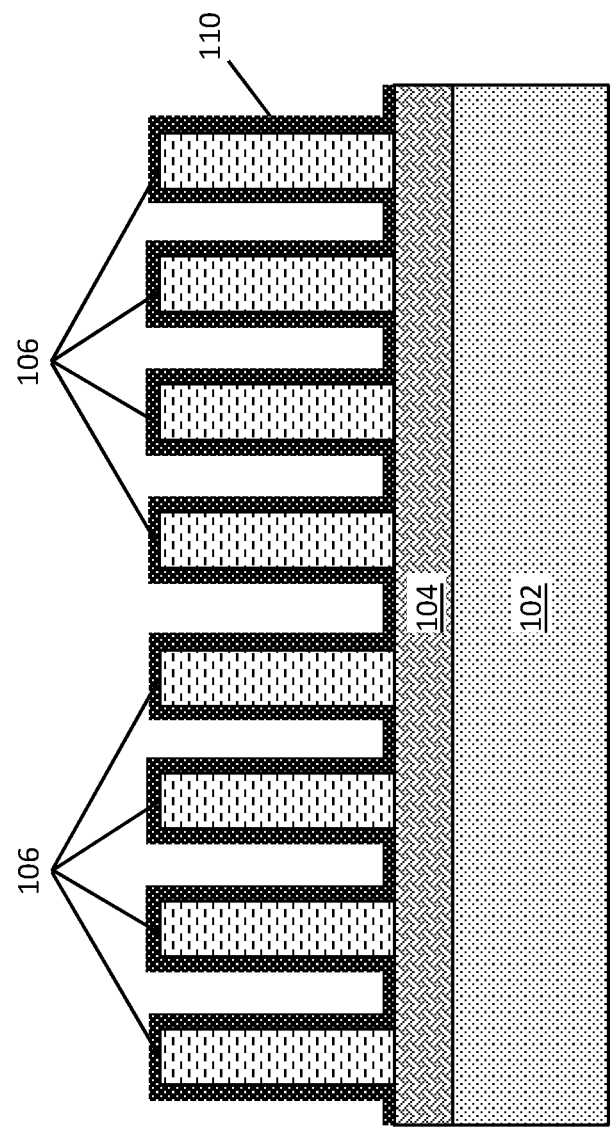

FIG. 1E depicts a cross-sectional side view after depositing an encapsulation layer 110 on the nano-patterned features 106. The encapsulation layer 110 is deposited as a thin layer that encapsulates exposed surfaces of the nano-patterned features 106 and base layer 104. The encapsulation layer 110 can also coat or partially coat exposed surfaces of the base layer 104, in addition to coating or partially coating the nanopatterned features 106. According to some embodiments of the present invention, the encapsulation layer 110 has a thickness of about 10 Å to about 500 Å.

Depending on the materials used for the encapsulation layer 110, various methods can be used to form the encapsulation layer 110. Electroplating, either by electrolytic (with a current source) or electroless (no electric current source), is a non-limiting examples of a method that can be used to form the encapsulation layer 110 on the nano-patterned features 106. Other methods include atomic layer deposition (ALD), chemical vapor deposition (CVD), physical vapor deposition (PVD), and other processes known to those skilled in the art.

According to one or more embodiments of the present invention, atomic layer deposition (ALD) is used to form the encapsulation 110. ALD can provide uniform coverage of a high precision to form a thin layer of the encapsulating metal over the nano-patterned features 106.

According to other embodiments, chemical vapor deposition (CVD) methods or physical vapor deposition (PVD) methods, e.g., sputtering, are used to form the encapsulation layer 110.

The encapsulation layer 110 includes one or more conductive materials. The conductive material can include a metallic material, including an alloy of more than one metal. The conductive material can include an alloy of metallic components, or metallic and non-metallic components. According to some embodiments of the present invention, the encapsulation layer 110 includes platinum. The conductive material of the encapsulation layer 110 can include, but is not limited to, copper, silver, gold, tungsten, aluminum, iron, palladium, nickel, titanium, zirconium, phosphorus, carbon, or a combination thereof. In one or more embodiments of the present invention, the conductive material is in a crystalline state.

Figure 1F:
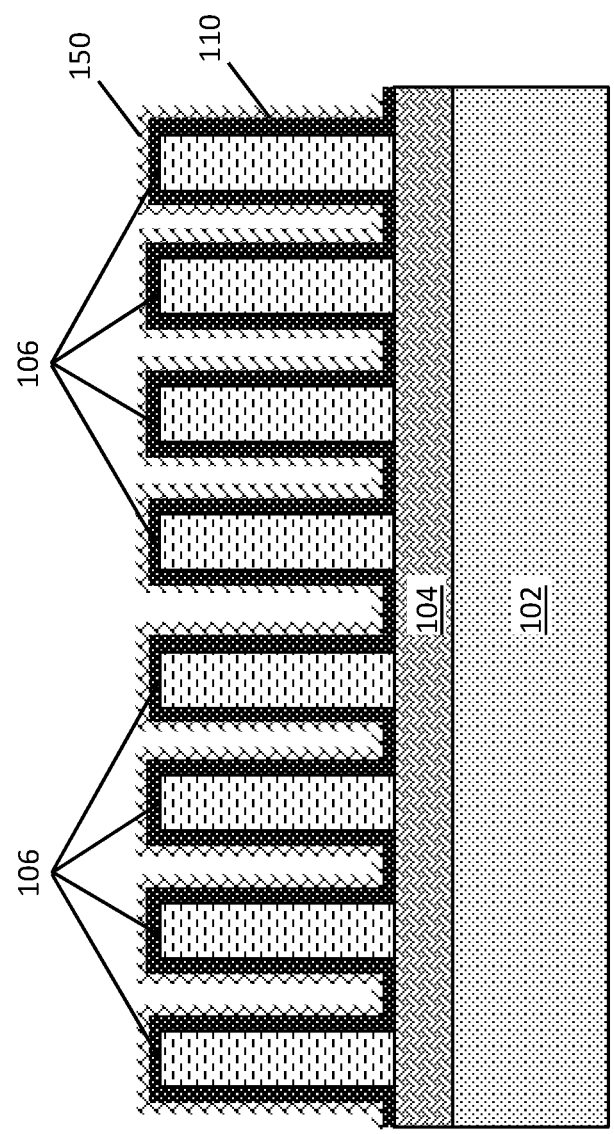

FIG. 1F depicts a cross-sectional side view after functionalizing the surface of the encapsulation layer 110. Functionalization refers to the process of applying a biological agent or other substance to enable a specific biological function for the sensor platform. After forming the base layer structure, in order to functionalize the structure to respond as a biosensor specifically to detect a desired biological agent, a biological functionalization material 150 can be applied to the surface of the base layer structure, including nano-patterned features 106. Any of the exposed areas of the base layer 104 or encapsulation layer 110 are also coated with the biological functionalization material 150. The nanostructure, with or without the biological functionalization material 150, can be used as a component such as a working electrode in various bio sensors which include other well-known components, such as but not limited to, reference and counter electrode structures.

"Biological functionalization material" refers to any bioreceptor that binds with a complementary target biomolecule to create a binding event. In some embodiments of the present invention, biochemical reactions involving the biological functionalization material 150, which would produce a reaction product upon binding with the target biomolecule. Non-limiting examples of biological functionalization materials 150 that can be used include an oligonucleotide, a nucleic acid, a peptide, a ligand, a protein, an enzyme, or any other material apt to bind with a complementary target biomolecule. When the nanostructure is used for glucose sensing, the biological functionalization material 150 can include glucose oxidase or glucose dehydrogenase. The biological functionalization material 150 can be applied to the nanostructure utilizing established biological functionalization processes known to those skilled in the art. Such biological functionalization processes can include a series of chemical reactions that attach the biological functionalization material 150 on the surface of the nanostructure.

Figure 2A:
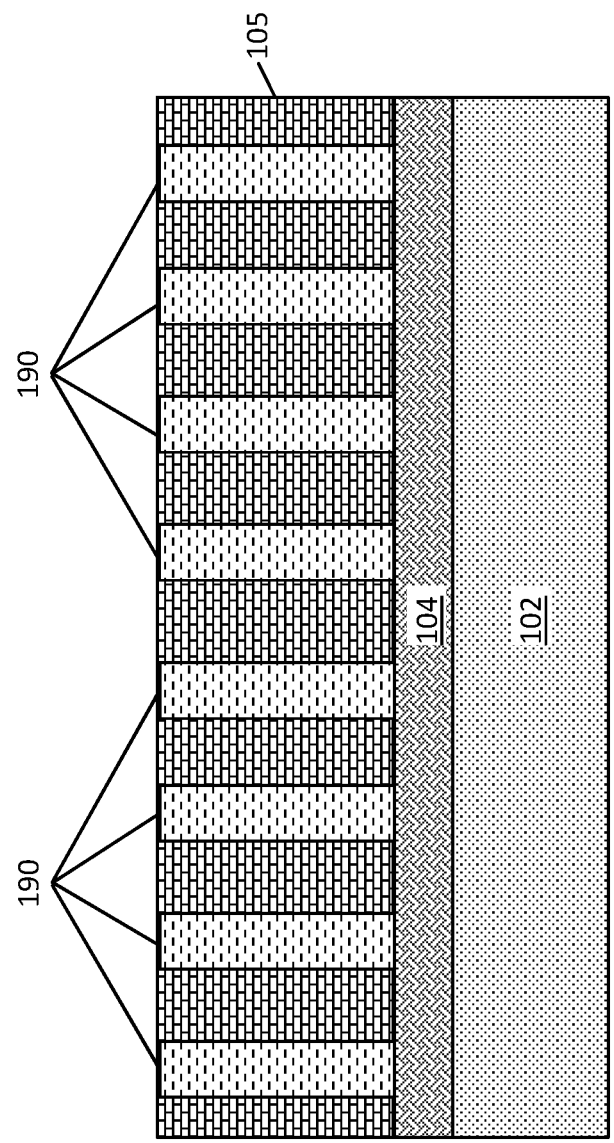

FIGS. 2A-2D depict a method of forming a nanostructure according to one or more embodiments of the present invention. FIG. 2A depicts a cross-sectional side view after depositing a material 190 in the openings of the patterning layer 105. Suitable materials 190 and deposition methods are discussed above.

Figure 2B:
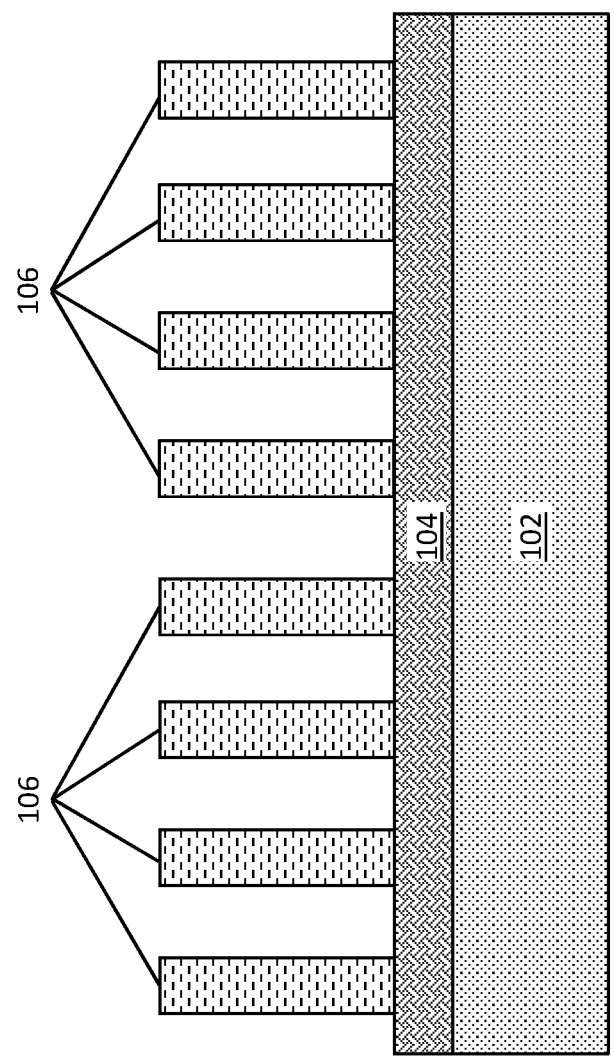

FIG. 2B depicts a cross-sectional side view after removing the patterning layer 105 to reveal an array of nano-patterned features 106 on the base layer 104. Dimensions and other parameters describing the nano-patterned features 106 are discussed above. According to exemplary embodiments of the present invention, the nano-patterned features 106 include gold and/or platinum.

Figure 2C:
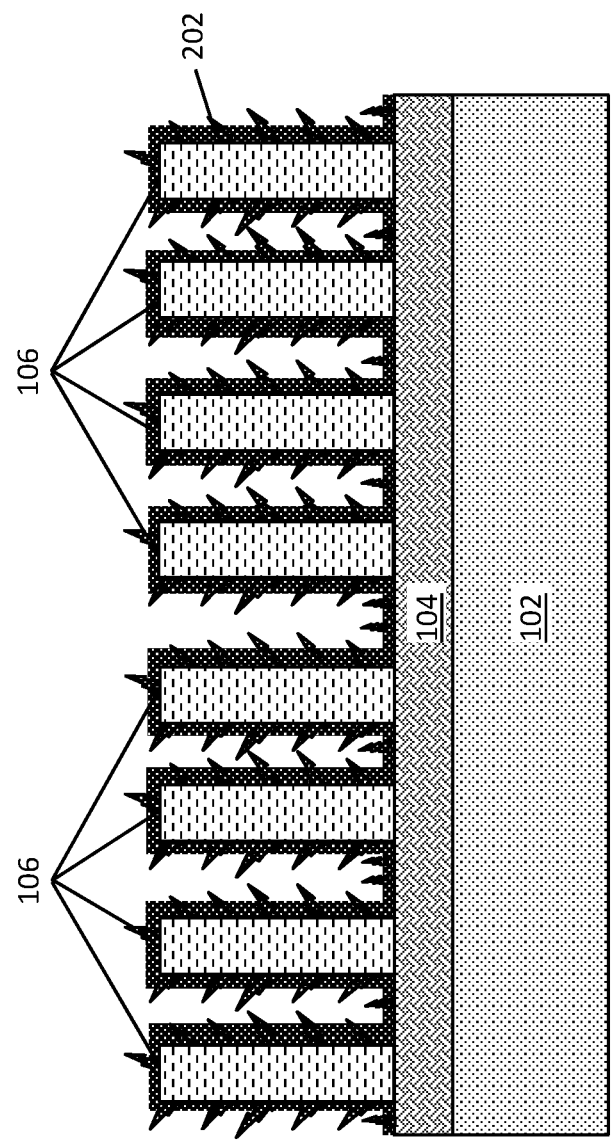

FIG. 2C depicts a cross-sectional side view after depositing a textured layer of metal 202 on the nano-patterned features 106. The textured layer of metal 202 is deposited as a coating on the exposed top and sidewall surfaces of the nano-patterned features 106. The textured layer of metal 202 may or may not cover exposed surfaces of the base layer 104. The textured layer of metal 202 includes a textured surface that appears "dendritic" (with branches or as treelike) according to some embodiments of the present invention. The textured layer of metal 202 provides a high surface area to the nanostructure that includes nano-patterned features 106.

The textured layer of metal 202 includes one or more conductive materials. The conductive material can include a metallic material, including an alloy of more than one metal. The conductive material can include an alloy of metallic components, or metallic and non-metallic components. According to some embodiments of the present invention, the textured layer of metal 202 includes platinum. The conductive material of the textured layer of metal 202 can include, but is not limited to, copper, silver, gold, tungsten, aluminum, iron, palladium, nickel, titanium, zirconium, phosphorus, carbon, or a combination thereof. In one or more embodiments of the present invention, the conductive material is in a crystalline state. In other embodiments of the present invention, the conductive material is in an amorphous state.

According to one or more embodiments of the present invention, the textured layer of metal 202 is deposited on the nano-patterned features 106 using electroplating. According to exemplary embodiments of the present invention, platinum black (Pt black), which is known to those skilled in the art, is used to form the layer of metal 202 using electroplating. Alternately, the textured layer of metal 202 can be formed by first a traditional un-textured layer using the methodology previously described to form encapsulation layer 110, followed by a subsequent etching process to the exposed surfaces of the base layer structure to result in the textured surface of metal 202. Etching processes can include reactive ion etching (ME) and/or wet chemical etching, depending on the composition metal 202.

Figure 2D:
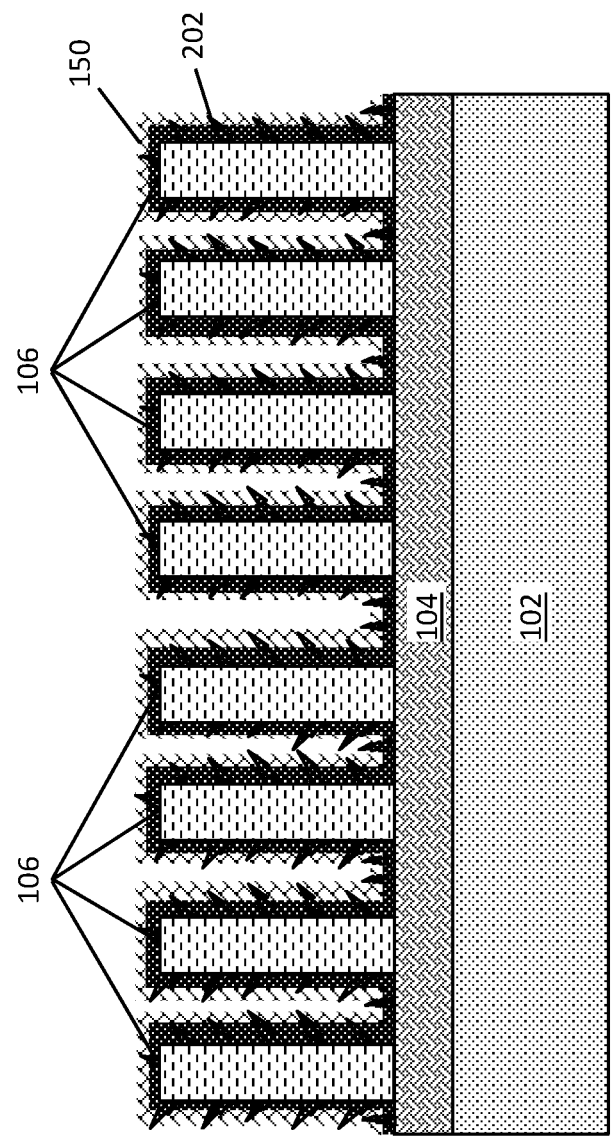

FIG. 2D depicts a cross-sectional side view after functionalizing the surface of the textured layer of metal 202. After forming the electrode structure, in order to functionalize the structure to respond as a biosensor sensitive to a specific agent, a biological functionalization material 150 can be applied to the surface of the nanostructure (nano-patterned features 106 with the textured layer of metal 202). The exposed surface areas of the base layer 104 can also be coated with the biological functionalization material 150. The nanostructure, with or without the biological functionalization material 150, can be used as a component such as a working electrode structure in various biosensor structures which include other well-known components, such as but not limited to, reference and counter electrode structures.

Figure 3A:
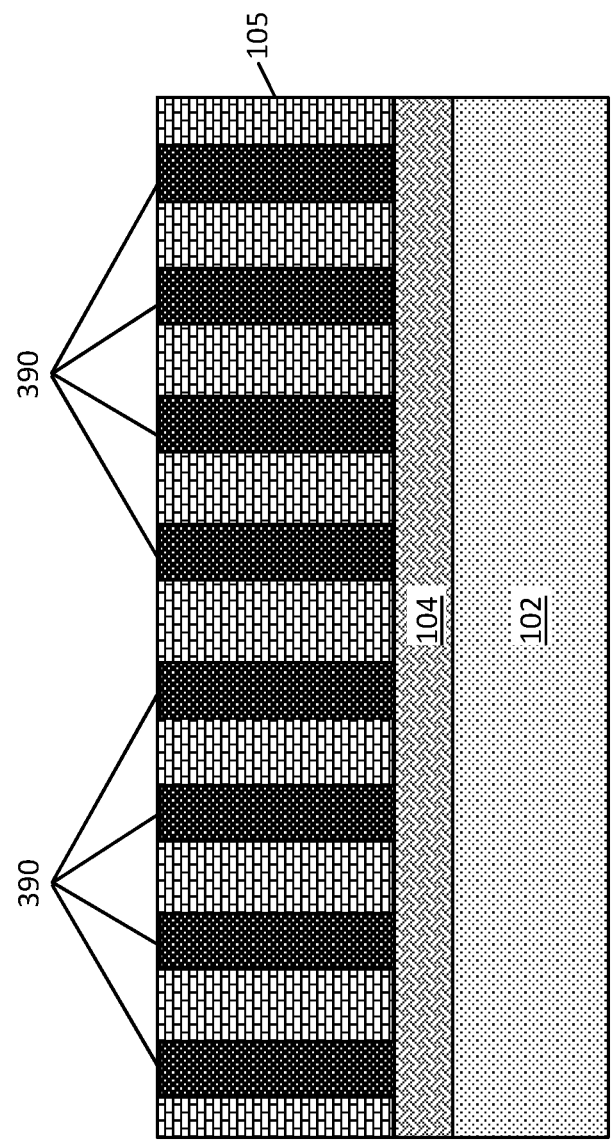

FIGS. 3A-3D depict a method of forming nanostructure according to one or more embodiments of the present invention. FIG. 3A depicts a cross-sectional side view after depositing a material 390 in the openings of the patterning layer 105. Suitable materials 190 and deposition methods are discussed above.

Figure 3B:
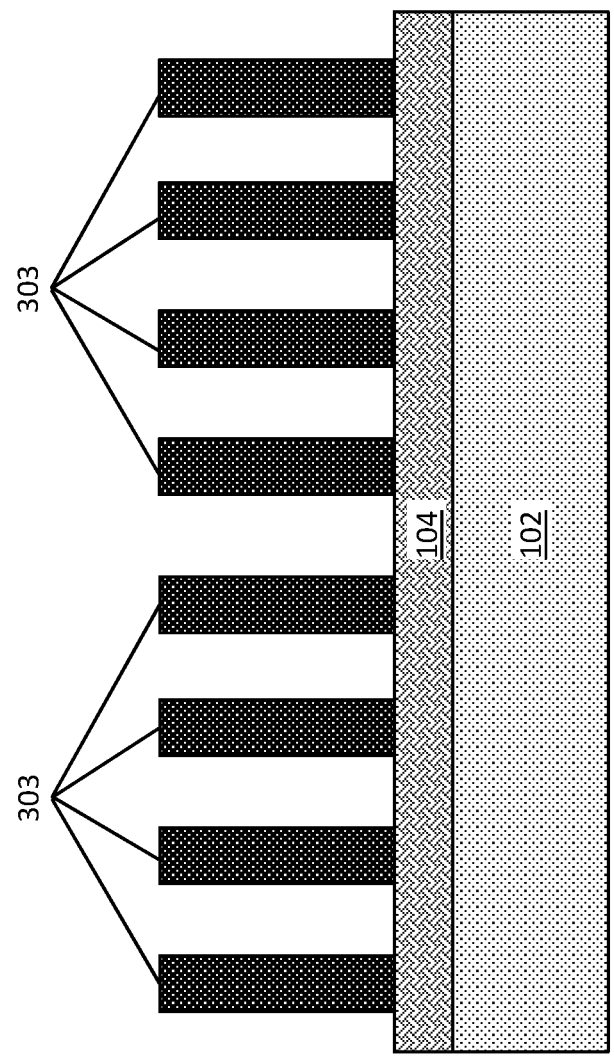

FIG. 3B depicts a cross-sectional side view after removing the patterning layer 105 to reveal an array of nano-patterned features 303 on the base layer 104. Dimensions and other parameters describing the nano-patterned features 303 are discussed above. According to exemplary embodiments of the present invention, the nano-patterned features 303 include platinum.

Figure 3C:
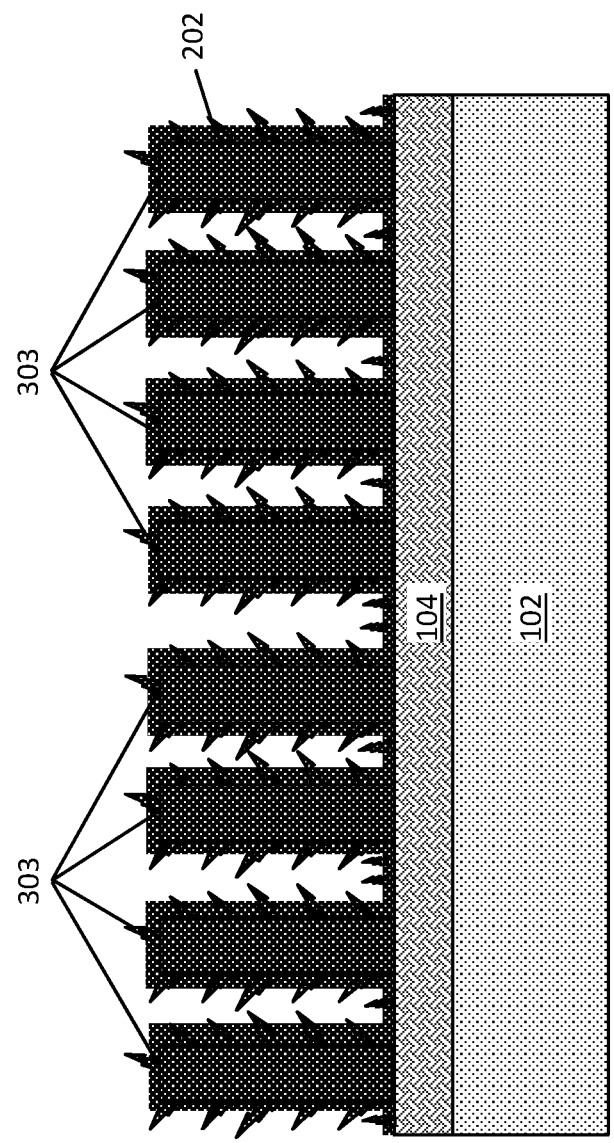

FIG. 3C depicts a cross-sectional side view after depositing a textured layer of metal 202 on the nano-patterned features 303. The textured layer of metal 202 is deposited as a coating that includes one or more conductive materials.

The textured layer of metal 202 may or may not cover exposed surfaces of the base layer 104. The textured layer of metal 202 includes a textured surface that appears "dendritic" (with branches or as tree-like) according to some embodiments of the present invention. The textured layer of metal 202 provides an increase in the exposed surface area.

According to some embodiments of the present invention, both the textured layer of metal 202 and the nano-patterned features 303 include the same conductive material, e.g., platinum.

According to exemplary embodiments of the present invention, platinum black (Pt black) is used to form the textured layer of metal 202 using electroplating. Alternately, the textured layer of metal 202 can be formed by first a traditional un-textured layer using the methodology previously described to form encapsulation layer 110, followed by a subsequent etching process to the exposed surfaces of the base layer structure to result in the textured surface of metal 202. Etching processes can include reactive ion etching (ME) and/or wet chemical etching, depending on the composition metal 202.

Figure 3D:
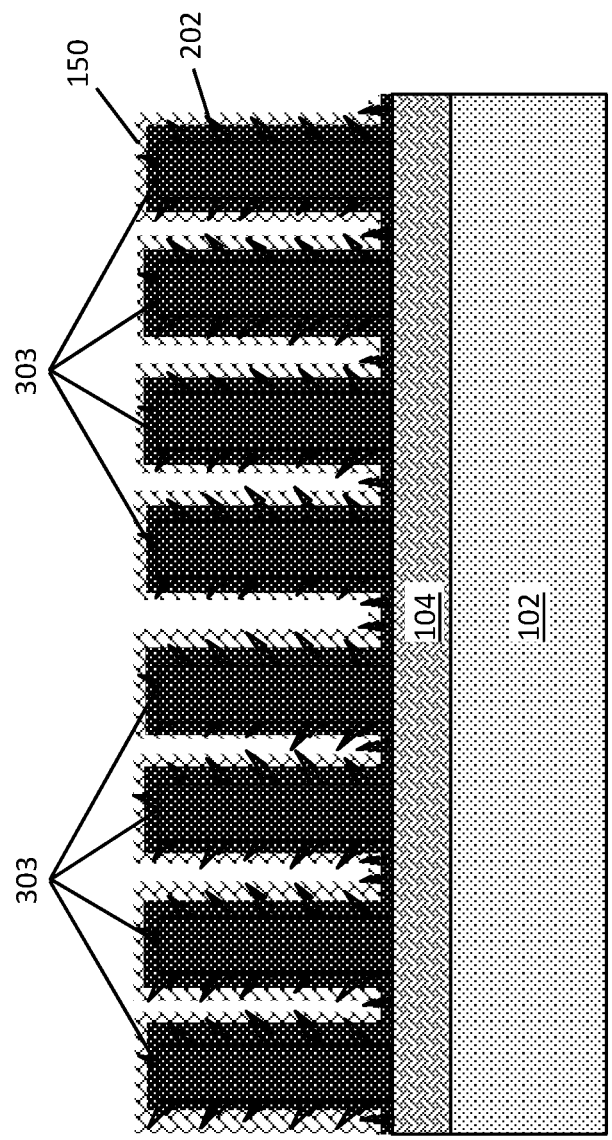

FIG. 3D depicts a cross-sectional side view after functionalizing the surface of the textured layer of metal 202. After forming the nanostructure, in order to functionalize the structure to respond as a biosensor sensitive to specific biological agents, a biological functionalization material 150 can be applied to the surface of the nanostructure (nano-patterned features 303 and the textured layer of metal 202). Any of the exposed areas of the base layer 104 are also coated with the biological functionalization material 150. The nanostructure, with or without the biological functionalization material 150, can be used as a component, such as a working electrode structure in various biosensor structures in various biosensors which include other well-known components, such as but not limited to, reference and counter electrode structures.

Figure 4A:
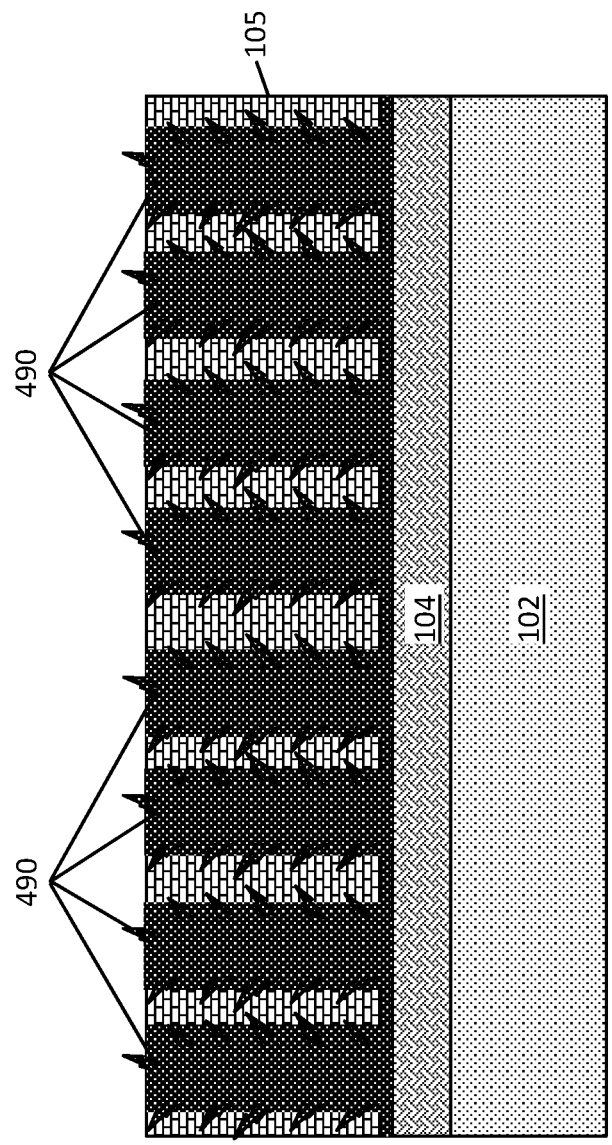
Figure 4B:
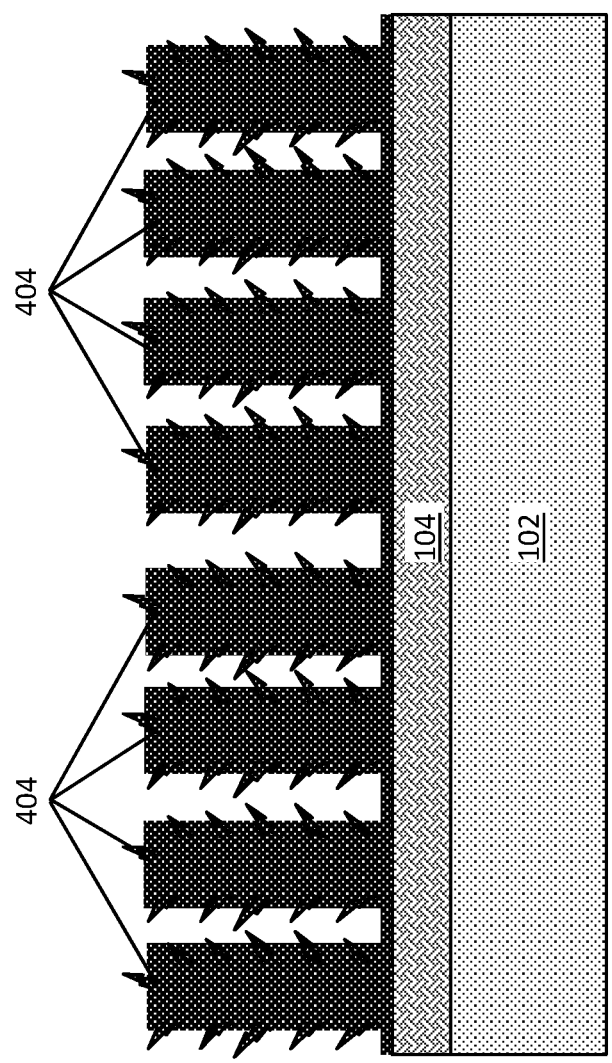
Figure 4C:
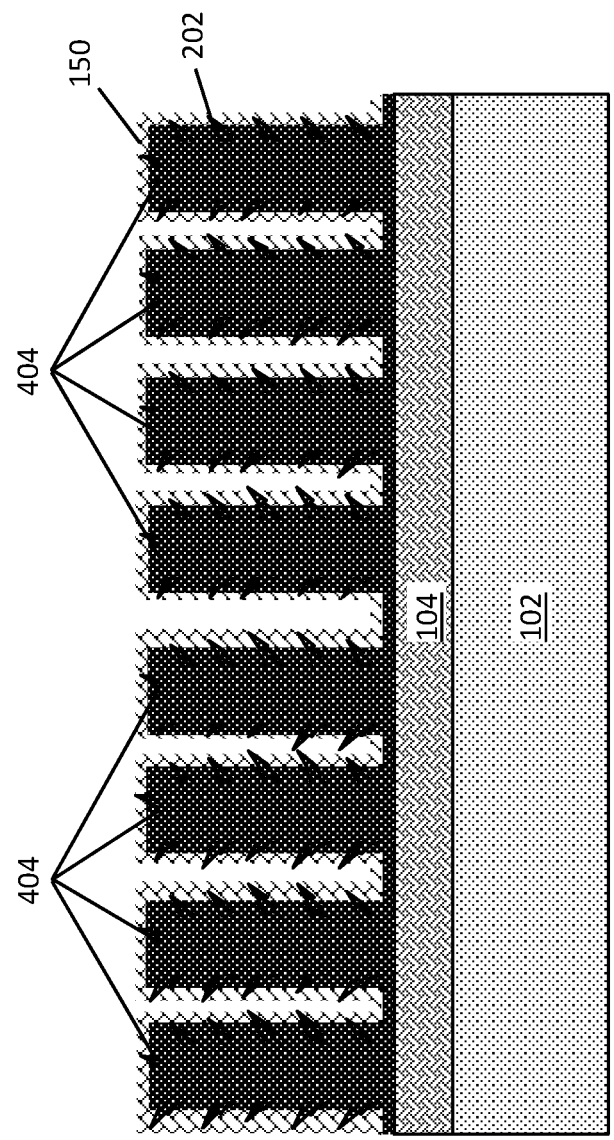

FIGS. 4A-4C depict a method of forming a nanostructure according to one or more embodiments of the present invention. FIG. 4A depicts a cross-sectional side view after depositing a material 490 in the openings of the patterning layer 105. Suitable materials 490 and deposition methods are discussed above.

FIG. 4B depicts a cross-sectional side view after removing the patterning layer 105 to reveal an array of nano-patterned features 404 having a textured surface on the base layer 104. Dimensions and other parameters describing the nano-patterned features 404 are discussed above. There is no interface formed between the base nano-patterned features 404 and textured surface finish. "No interface" is defined as the nano-patterned features 404 and the textured surface are of unitary construction (i.e., one piece) and unitary composition (i.e., a same material).

The nano-patterned features 404 with the textured surface can be formed by any methods suitable for the materials used to form the nano-patterned features 404. A non-limiting example of a method that can be used to form the nano-patterned features 404 with the textured surface includes electroplating. Regarding the process of depositing material 490 to form nano-patterned features 404, it should be noted that material 490 is not required to fill the entirety of the openings of the patterning layer 105 (aka nano-patterned features 404 are not required to be fully dense) in order to produce the textured surface on nanopatterned features 404. Alternately, nano-patterned features 404 can be formed as previously described and directly followed by a subsequent etching process to produce a textured surface of nano-patterned features 404. Etching processes can include reactive ion etching (RIE) and/or wet chemical etching, depending on the composition nano-patterned features 404.

The textured surface appears "dendritic" (with branches or as tree-like) according to some embodiments of the present invention. The textured surface enhances the exposed surface area of the nanofeatures. According to one or more embodiments of the present invention, the nano-patterned features 404 having the textured surface include platinum.

According to exemplary embodiments of the present invention, platinum black (Pt black) is used to form the nano-patterned features 404 having the textured surface using electroplating.

FIG. 4C depicts a cross-sectional side view after functionalizing the surface of the nano-patterned features 404 with the textured surface. After forming the nanostructure, in order to functionalize the structure to respond as a biosensor sensitive to specific biological agents, a biological functionalized material 150 can be applied to the surface of the nanostructure (nano-patterned features 404 with the textured surface). Any of the exposed areas of the base layer 104 are also coated with the biological functionalization material 150. The nanostructure, with or without the biological functionalization material 150, can be used as a component, such as a working electrode structure in various bio sensor structures which include other well-known components, such as but not limited to, reference and counter electrode structures.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a nanostructure, the method comprising:
    coating an exposed surface of a base layer with a patterning layer;
    forming a pattern in the patterning layer comprising nano-patterned non-random openings, such that a bottom portion of the non-random openings provides direct access to the exposed surface of the base layer;
    depositing a material in the non-random openings in the patterning layer, such that the material contacts the exposed surface to produce repeating individually articulated nano-scale features;
    removing remaining portions of the patterning layer; and
    forming an encapsulation layer on exposed surfaces of the repeating individually articulated nanoscale features and the exposed surface of the base layer.

2. The method of claim 1, wherein depositing the material in the non-random openings in the patterning layer comprises electroplating, physical vapor deposition, or atomic layer deposition.

3. The method of claim 1, wherein the material of the repeating individually articulated nanoscale features comprises gold, platinum, copper, silver, tungsten, aluminum, iron, palladium, nickel, titanium, zirconium, phosphorus, carbon, or a combination thereof.

4. The method of claim 1, wherein the encapsulation layer comprises platinum, copper, silver, gold, tungsten, aluminum, iron, palladium, nickel, titanium, zirconium, phosphorus, carbon, or a combination thereof.

5. The method of claim 1, wherein the base layer comprises an electrically conductive material.

6. The method of claim 1, wherein depositing the encapsulation layer comprises atomic layer deposition or physical vapor deposition.

7. The method of claim 1, wherein the repeating individually articulated features comprise rods, cones, or annular structures, each having a critical dimension from about 5 to 900 nm, and a height from about 5 nm to about 20 µm.

8. The method of claim 1 further comprising attaching a biological functionalization material to the encapsulation layer.

9. The method of claim 1, wherein the encapsulation layer coats all exposed surfaces of the repeating individually articulated nanoscale features.

10. A method of forming a nanostructure, the method comprising:
   coating an exposed surface of a base layer with a patterning layer;
   forming a pattern in the patterning layer comprising nano-patterned non-random openings, such that a bottom portion of the non-random openings provides direct access to the exposed surface of the base layer;
   depositing a material in the nano-patterned non-random openings in the patterning layer, such that the material contacts the exposed surface to produce repeating individually articulated nano-scale features;
   removing remaining portions of the patterning layer; and
   forming a textured layer on exposed surfaces of the repeating individually articulated nanoscale features and the exposed surface of the base layer.

11. The method of claim 10, wherein depositing the material in the non-random openings in the patterning layer comprises electroplating, physical vapor deposition, or atomic layer deposition.

12. The method of claim 10, wherein the textured layer comprises dendritic structures.

13. The method of claim 10, wherein the material of the repeating individually articulated nanoscale features comprises gold, platinum, copper, silver, tungsten, aluminum, iron, palladium, nickel, titanium, zirconium, phosphorus, carbon, or a combination thereof.

14. The method of claim 10, wherein the textured layer comprises platinum, copper, silver, gold, tungsten, aluminum, iron, palladium, nickel, titanium, zirconium, phosphorus, carbon, or a combination thereof.

15. The method of claim 10 further comprising attaching a biological functionalization material to the textured layer.

16. The method of claim 10, wherein the repeating individually articulated features comprise rods, cones, or annular structures, each having a critical dimension from about 5 to 900 nm, and a height from about 5 nm to about 20 µm.

17. The method of claim 10, wherein the textured layer is a coating covering all exposed top and sidewall surfaces of the repeating individually articulated nanoscale features.

* * * * *